United States Patent
Todrzak

(10) Patent No.: US 10,915,153 B2
(45) Date of Patent: Feb. 9, 2021

(54) DEVICE FOR MOBILE DEVICE TEMPERATURE CONTROL

(71) Applicant: Joseph Todrzak, Gig Harbor, WA (US)

(72) Inventor: Joseph Todrzak, Gig Harbor, WA (US)

( * ) Notice: Subject to any disclaimer, the term of this patent is extended or adjusted under 35 U.S.C. 154(b) by 344 days.

(21) Appl. No.: 16/177,357

(22) Filed: Oct. 31, 2018

(65) Prior Publication Data

US 2019/0129482 A1    May 2, 2019

Related U.S. Application Data

(60) Provisional application No. 62/580,355, filed on Nov. 1, 2017.

(51) Int. Cl.
*G06F 1/20* (2006.01)
*G06F 1/16* (2006.01)
(Continued)

(52) U.S. Cl.
CPC .............. *G06F 1/206* (2013.01); *B60R 11/02* (2013.01); *G06F 1/1632* (2013.01); *G06F 1/203* (2013.01); *H04M 1/04* (2013.01); *B60R 2011/0075* (2013.01); *G06F 1/1626* (2013.01); *G06F 2200/201* (2013.01); *H05K 7/20* (2013.01); *H05K 7/20172* (2013.01)

(58) Field of Classification Search
CPC ........ G06F 1/206; G06F 1/1632; G06F 1/203; G06F 1/1626; G06F 2200/201; G06F 1/20; B60R 11/02; B60R 2011/0075; H04M 1/04; H05K 7/20; H05K 7/20172; H05K 7/20145; H05K 7/20136
See application file for complete search history.

(56) References Cited

U.S. PATENT DOCUMENTS

D658,169 S  *  4/2012  Mo .............................. D14/253
8,496,213 B1 *  7/2013  Kunert ................... B41J 29/377
                                                      248/176.1
(Continued)

OTHER PUBLICATIONS

International search report and written opinion of the International Searching Authority dated Feb. 28, 2019.

*Primary Examiner* — Binh B Tran
*Assistant Examiner* — Michael A Matey
(74) *Attorney, Agent, or Firm* — Puget Patent; Michael Gibbons

(57) ABSTRACT

The present invention is a docking station that consists essentially of two cradle arms and a central cradle portion including one or more temperature control units. It may include a case configured to allow heat transfer between a mobile device and the temperature control units. It may include both a heating element and a cooling element, wherein each of the elements are configured to engage at particular temperatures. It may include control units and temperature sensors. The cradle arms may include upper cradle hooks and lower cradle hooks to securely hold a mobile device. The case may be configured to securely receive the cradle hooks. The cradle arms may include upper and lower portions that are spring coupled. The docking station may include one or more locks that lock the upper and lower arm portions in their relative positions to prevent theft of a docked mobile device.

20 Claims, 10 Drawing Sheets

(51) Int. Cl.
*H04M 1/04* (2006.01)
*B60R 11/02* (2006.01)
*H05K 7/20* (2006.01)
*B60R 11/00* (2006.01)

(56) References Cited

U.S. PATENT DOCUMENTS

| | | | | |
|---|---|---|---|---|
| 9,836,101 | B1* | 12/2017 | Saravis | G06F 1/206 |
| 10,208,777 | B1* | 2/2019 | Brassard | F16M 11/041 |
| 10,557,590 | B1* | 2/2020 | Brassard | F16M 11/14 |
| 10,617,202 | B1* | 4/2020 | Cardona | A47B 97/08 |
| 2006/0158844 | A1* | 7/2006 | Lee | G06F 1/1632 |
| | | | | 361/679.46 |
| 2007/0152633 | A1* | 7/2007 | Lee | G06F 1/1632 |
| | | | | 320/114 |
| 2007/0262223 | A1* | 11/2007 | Wang | F16M 13/00 |
| | | | | 248/346.07 |
| 2008/0217826 | A1* | 9/2008 | Kim | B60R 11/0258 |
| | | | | 269/21 |
| 2009/0294617 | A1* | 12/2009 | Stacey | H04B 1/3877 |
| | | | | 248/316.1 |
| 2010/0038497 | A1* | 2/2010 | Liu | G06F 1/203 |
| | | | | 248/163.1 |
| 2013/0069291 | A1* | 3/2013 | Roma | A47C 23/0438 |
| | | | | 267/151 |
| 2013/0126688 | A1* | 5/2013 | Li | F16M 13/00 |
| | | | | 248/276.1 |
| 2014/0168885 | A1* | 6/2014 | Williams | G06F 1/1632 |
| | | | | 361/679.43 |
| 2015/0223590 | A1* | 8/2015 | Arias-Tabima | A45F 5/021 |
| | | | | 224/195 |
| 2016/0318455 | A1* | 11/2016 | Zhang | F16M 11/2007 |
| 2017/0086314 | A1* | 3/2017 | Simon | F16M 11/40 |
| 2017/0110902 | A1* | 4/2017 | Miller | H02J 7/0044 |
| 2017/0136960 | A1* | 5/2017 | Kim | B60R 11/02 |
| 2017/0318958 | A1* | 11/2017 | Asante | A47B 19/06 |
| 2018/0043840 | A1* | 2/2018 | Minn | B60R 11/02 |
| 2018/0236947 | A1* | 8/2018 | Siegel | G06F 1/166 |
| 2019/0353189 | A1* | 11/2019 | Saculles | F16B 2/12 |
| 2020/0212693 | A1* | 7/2020 | Alves | H02J 7/027 |

* cited by examiner

DEVICE FOR MOBILE DEVICE TEMPERATURE CONTROL

PRIORITY CLAIM

The present application claims priority from U.S. provisional patent application No. 62/580,355, naming Joe Todrzak as the inventor, filed Nov. 1, 2017. The foregoing application is hereby incorporated by reference in its entirety as if fully set forth herein.

FIELD OF THE INVENTION

This invention relates generally to mobile electronic devices, and more specifically to temperature control for mobile electronic devices.

BACKGROUND OF THE INVENTION

Tablets, mobile phones, and "phablets" are known to overheat with use or while in direct sun. Similarly, mobile devices are known to run poorly or even to become susceptible to water intrusion from condensation when temperatures are too low.

The Federal Motor Carrier Safety Administration (FMCSA), a division of the Department of Transportation, passed a rule in 2015 that mandates electronic logging devices (ELD) for employers, employees, and commercial motor vehicles that transport property or passengers in interstate commerce. These devices are subject to federal oversight, and consist largely of tablet-style devices. They must be capable of recording the mandated information, including whether a driver is on or off duty, in any conceivable condition, including extreme temperatures. Therefore, it is imperative that drivers have access to their tablets regardless of the temperature inside or outside the vehicle.

SUMMARY OF THE INVENTION

This invention relates generally to mobile electronic devices, and more specifically to temperature control for mobile electronic devices.

The invention consists primarily of a cradle for mobile communication devices such as smartphones, tablets, and "phablets". A "phablet" is a large mobile communication device, similar in size to a tablet, that is capable of making and receiving calls. It should be understood that smartphone, tablet, and phablet are not meant to be limited to those devices commercially available to the public at large. It should also be construed to include any device registered with the FMCSA before and at the time of filing or in the future. While all of smartphones, tablets, phablets, and folding or convertible laptops are contemplated here, one particular mobile communication device may be primarily referenced for the sake of brevity.

The cradle may be configured to securely fix the tablet in position by way of a mounting post. The mounting post may be configured to mount to a dash, a seat, a floorboard, a windshield, or another structure of the vehicle, by a bolt-style fastener, a ball-and-socket fastener, or with a suction-style fastener. The mounting post may include a ball-and-socket style mount. The mount and the cradle may be removably coupleable, but they may be generally left in place, as the tablet may be encased in a case configured to be removably coupleable with the cradle.

When the cradle is in place, it may be configured such that it does not obstruct the driver's field of view when looking at the road, but that the driver can glance at the tablet without becoming distracted. It is considered a "hands-free" safety device.

The cradle may be designed to allow quick docking and undocking of a tablet device. Upper and lower arms may form the primary structure to support the tablet in place. The upper and lower arms may be coupled with a flexible element, such as a spring, to allow controlled displacement of the upper and lower arms relative to each other. For example, a spring may allow the upper arms to extend vertically away from the lower arms to allow the tablet to be inserted, and then the spring will return the upper arms to their proper position, securing the tablet to the cradle.

The cradle may include one or more temperature control elements, such as a cooling element or a heating element. Either of the heating or cooling elements may be operable through conduction, convection or radiation. The one or more temperature control elements may be controlled through a control unit including a thermostat, and may be configured to engage at certain temperature thresholds. Any of the one or more temperature control elements may include their own thermostatic device, or a single whole-system thermostat may be deployed. Additionally or alternatively, one or more thermostats may be positioned to be in direct contact with the tablet when the tablet is in the cradle, and may be insulated or isolated from either of the temperature control elements.

The control unit may be configured to be a standalone unit, run on battery power. In preferred embodiments, the control unit may be configured to be hardwired into the vehicle's power system. This ensures that the temperature control elements are not subject to being unpowered due to a dead battery. In addition to powering the temperature control elements and the thermostat, the control unit power system may be able to provide charging power through a magnetic docking system. The magnetic docking system may be configured to automatically charge the tablet whenever the device is placed into the cradle. A connector dongle, such as an 8-pin dongle or a micro-USB dongle, may be permanently placed in the charging port of the tablet. A magnetic connector on the other end of the dongle completes the circuit when the tablet is placed in the cradle, allowing power to flow to the tablet as needed. In combination with the hardwired control unit, through which the power for the charger may be directed, this keeps the tablet powered and available for ELD compliance, and it mitigates the risk of the driver forgetting to charge the device.

The cradle may be configured to secure a bare tablet, such as one without a case. In other embodiments, the cradle may be configured to secure a tablet with a particularly designed case. The case may be configured to receive one or more of the cradle arms or cradle arm hooks to allow the case, and thus the tablet, to be fixed in place within the cradle.

The case may be a single piece or may be comprised of two or more primary pieces. The case may be substantially waterproof or water resistant, and it may be constructed of a durable material, such as thermoplastic polyurethane. The case may be configured to be shock absorbing, and it may include sealed buttons in place over the buttons of the tablet in order to prevent water and particle intrusion. As such, it should be understood that the precise placement of buttons and features such as camera holes will be dependent on the particular tablet for which the case is designed.

The case may be configured to allow the one or more temperature control elements to alter the temperature of the tablet. For example, the case may include one or more gaps to allow radiant heat to reach the back of the tablet, warming the tablet when the tablet temperature gets too cold. Similarly, the case may include one or more gaps configured to allow directed airflow over the tablet in order to cool it. The case may include gaps to allow use of the tablet camera, to allow use of the headphone jack, and so on. The case may include the dongle for insertion into the charging port of the device, or it may include an extender to couple the dongle with the end of the magnetic charger through the width of the case wall.

In addition to the foregoing, various other methods, systems and/or program product embodiments are set forth and described in the teachings such as the text (e.g., claims, drawings and/or the detailed description) and/or drawings of the present disclosure.

The foregoing is a summary and thus contains, by necessity, simplifications, generalizations and omissions of detail; consequently, those skilled in the art will appreciate that the summary is illustrative only and is NOT intended to be in any way limiting. Other aspects, embodiments, features and advantages of the device and/or processes and/or other subject matter described herein will become apparent in the teachings set forth herein.

BRIEF DESCRIPTION OF THE DRAWINGS

Certain embodiments of the present invention are described in detail below with reference to the following drawings.

DETAILED DESCRIPTION

This invention relates generally to mobile electronic devices, and more specifically to temperature control for mobile electronic devices.

Specific details of certain embodiments of the invention are set forth in the following description and in FIGS. 1-10 to provide a thorough understanding of such embodiments. The present invention may have additional embodiments, may be practiced without one or more of the details described for any particular described embodiment, or may have any detail described for one particular embodiment practiced with any other detail described for another embodiment.

Importantly, a grouping of inventive aspects in any particular "embodiment" within this detailed description, and/or a grouping of limitations in the claims presented herein, is not intended to be a limiting disclosure of those particular aspects and/or limitations to that particular embodiment and/or claim. The inventive entity presenting this disclosure fully intends that any disclosed aspect of any embodiment in the detailed description and/or any claim limitation ever presented relative to the instant disclosure and/or any continuing application claiming priority from the instant application (e.g. continuation, continuation-in-part, and/or divisional applications) may be practiced with any other disclosed aspect of any embodiment in the detailed description and/or any claim limitation. Claimed combinations which draw from different embodiments and/or originally-presented claims are fully within the possession of the inventive entity at the time the instant disclosure is being filed. Any future claim comprising any combination of limitations, each such limitation being herein disclosed and therefore having support in the original claims or in the specification as originally filed (or that of any continuing application claiming priority from the instant application), is possessed by the inventive entity at present irrespective of whether such combination is described in the instant specification because all such combinations are viewed by the inventive entity as currently operable without undue experimentation given the disclosure herein and therefore that any such future claim would not represent new matter.

Figure 1:
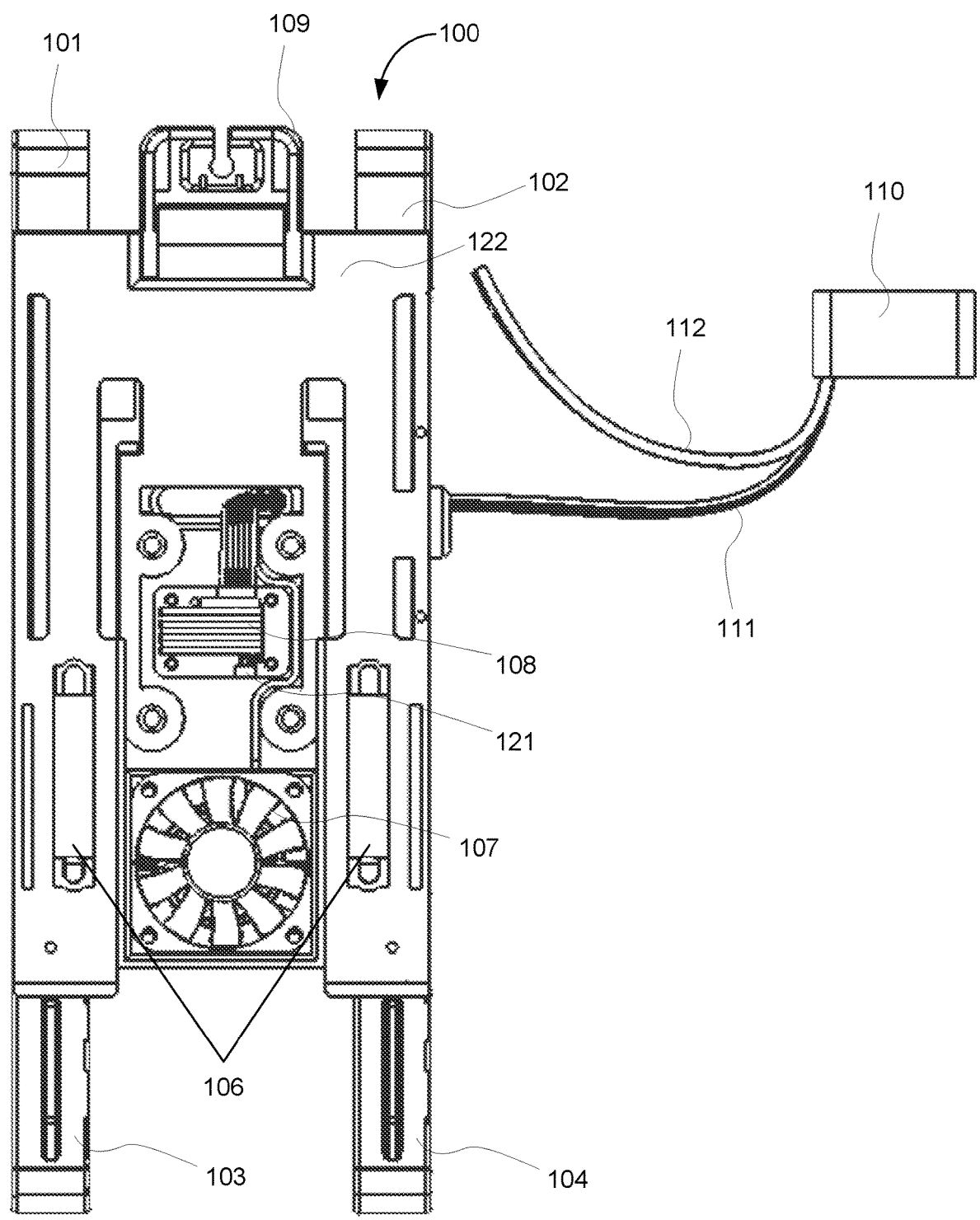
FIG. 1 is a front view of one embodiment of the cradle.
Figure 9:
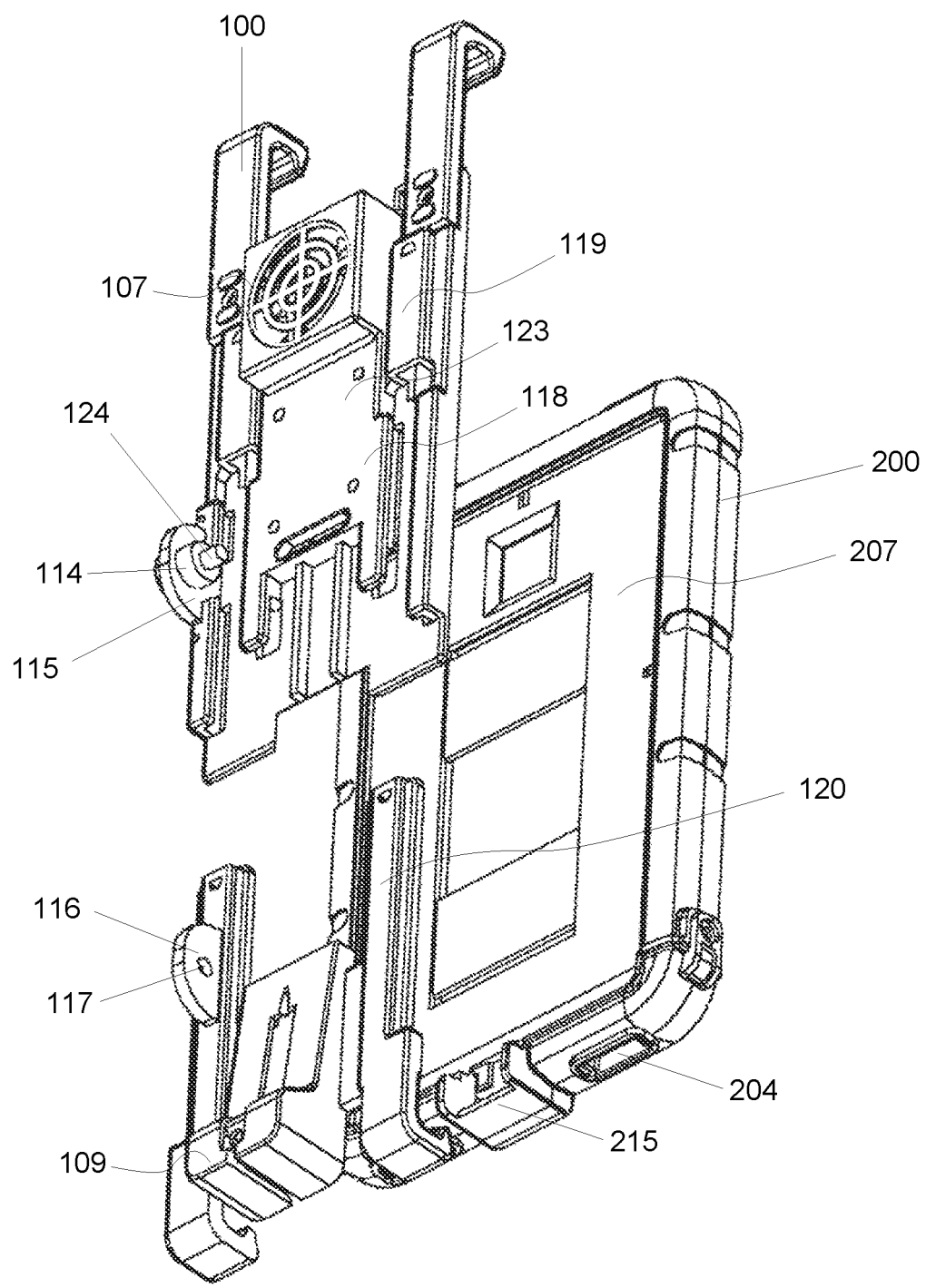
FIG. 9 is a rear exploded view of one embodiment of the case in place in one embodiment of the cradle.

FIG. 1 is a front view of one embodiment of cradle 100. Cradle 100 may include two upper arms, 101 and 102, and two lower arms, 103 and 104. Upper arm 101 may be configured to be disposed in line with lower arm 103, and upper arm 102 may be configured to be disposed in line with lower arm 104. Arm 101 may be flexibly coupled with arm 103 by flexible element 106, and likewise with arms 102 and 104. When the cradle 100 receives a tablet, arms 101 and 102 may extend away from arms 103 and 104, or vise versa. Once the tablet is in place, flexible element 106 may return the arms to their positions relative to each other. In some embodiments, arms 101 and 102 are on an upper portion of the cradle, and arms 103 and 104 are on a lower portion. When the cradle is extended to allow a tablet to be inserted or removed, arms 101 and 102 may move together, such that the displacement between arm 101 and 103 is the same as the displacement between arm 102 and 104. FIG. 9 depicts this feature in more detail.

Cradle 100 may include at least one cooling element 107. Cooling element 107 may be an element configured to cool a tablet in the cradle 100 by any of conduction, convection or radiation. In preferred embodiments, cooling element 107 may be a fan configured to induce air flow over one or more surfaces of the tablet, causing hot air to flow away and cool air to flow around the tablet.

Cradle 100 may also include at least one heating element 108. Heating element 108 may be an element configured to heat cool a table in the cradle 100 by any of conduction, convection or radiation. In preferred embodiments, heating element 108 may be a radiant heat source, causing the air around the tablet, and thus the tablet itself, to warm.

Either or both of cooling element 107 or heating element 108 may include a thermostatic device 121. In other embodiments, a thermostatic device 121 may be housed in the control unit 110, which may be alternatively referred to as the control box or the control device. This type of embodiment may allow insulation from the heating and cooling elements, allowing the thermostatic device to more accurately measure the ambient temperature. In other embodiments, a thermostatic device 121 may be placed such that it measures the temperature as close as possible to the tablet, such as on or near the box holding heating element 108 or cooling element 107. This is the particular embodiment depicted in FIG. 1. In this type of configuration, the thermostatic device 121 may be isolated or insulated from the heating or cooling elements. The thermostatic device 121 may be any of a mechanical, electric, or electromechanical thermostats, such as bimetallic thermostats, wax pellet thermostats, pneumatic thermostats, two-wire thermostats, millivolt thermostats, 24-volt thermostats, line voltage thermostats, or a digital thermostat.

The thermostatic device 121 or devices may be configured to turn on the cooling element 107 or the heating element 108 when the ambient temperature of the vehicle or immediately proximate to the tablet reaches a particular point. For example, the heating element 108 may be engaged when the ambient temperature is less than 12 degrees Celsius, the cooling element may be engaged when the temperature is greater than 30 degrees Celsius, and in the temperature range from 12 to 30 degrees Celsius, neither the cooler nor the heater may be engaged. It should be understood that these temperatures are exemplary, and may vary depending on the specifications of a particular ELD. In embodiments where each of cooling element 107 and heating element 108 have their own thermostatic devices, the configuration may be binary at a particular temperature, such as on at 12 degrees Celsius and off at 12.1 degrees Celsius for the heating element. In embodiments where there is a single thermostatic device 121, the thermostatic device may be wired to the control unit 110 with wiring 111, and the control unit may have the switching mechanism for the cooling element 107 and the heating element 108. In this type of embodiment, switching signals may be transmitted from control unit 110 to the cooling element 107 and the heating element 108 over wiring 111. This type of configuration would work whether the single thermostatic device 121 was located proximate to the tablet, as depicted in FIG. 1, or whether it was located in or proximate to the control unit 110.

Control unit 110 may be configured to operate on battery power. This type of configuration might be best suited for short-haulers, who are more likely to be home and able to charge their devices more often. In preferred embodiments, control unit 110 may be configured to be wired directly into the vehicle's power with wiring 112. This provides a constant, reliable source of power for the cradle 100, and mitigates or prevents the risk of the cradle losing power and being unable to heat or cool the tablet. Additionally, batteries themselves can be subject to failure at high or low temperatures, which is also prevented by hardwiring the control unit 110 to the vehicle's power.

Cradle 100 may additionally include a magnetic charger frame 109, configured to house a magnetic docking system for chargers. The magnetic docking system may be configured to automatically charge the tablet whenever the device is placed into the cradle. A connector dongle, such as an 8-pin dongle or a micro-USB dongle, may be permanently placed in the charging port of the tablet. A magnetic connector on the other end of the dongle finds its magnetic mate and completes the circuit when the tablet is placed in the cradle, allowing power to flow to the tablet as needed. In combination with the hardwired control unit, through which the power for the charger may be directed, this keeps the tablet powered and available for ELD compliance, and it mitigates the risk of the driver forgetting to charge the tablet. The magnetic charger frame 109 may be configured to hold or guide the wired portion of the magnetic connector, allowing for a quick charging connection when the tablet is placed in cradle 100. Portions of cradle 100 that do not contain one of the elements described herein may be solid, forming a front surface 122 and a rear surface 118, depicted in FIG. 9.

Figure 2:
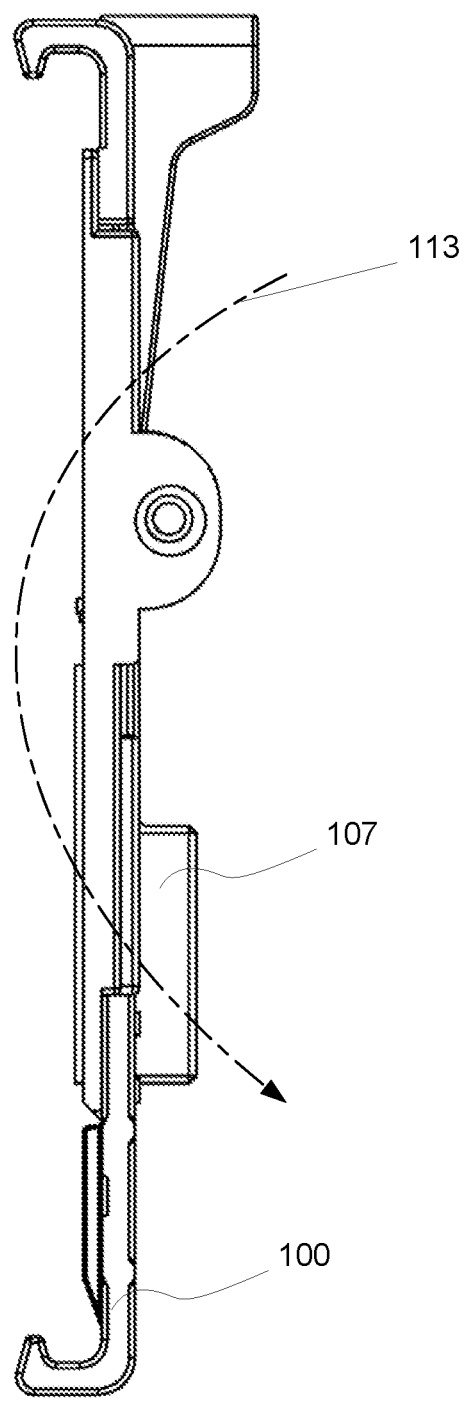
FIG. 2 is a side view thereof.

FIG. 2 is a side view of one embodiment of cradle 100, where line 113 shows the direction of air flow when cooling element 107 is on. Cooling element 107, contemplated here as being a fan, blows hot air away from the tablet, drawing in cooler air and creating a cooling effect by moving cooler air over the tablet.

Figure 3:
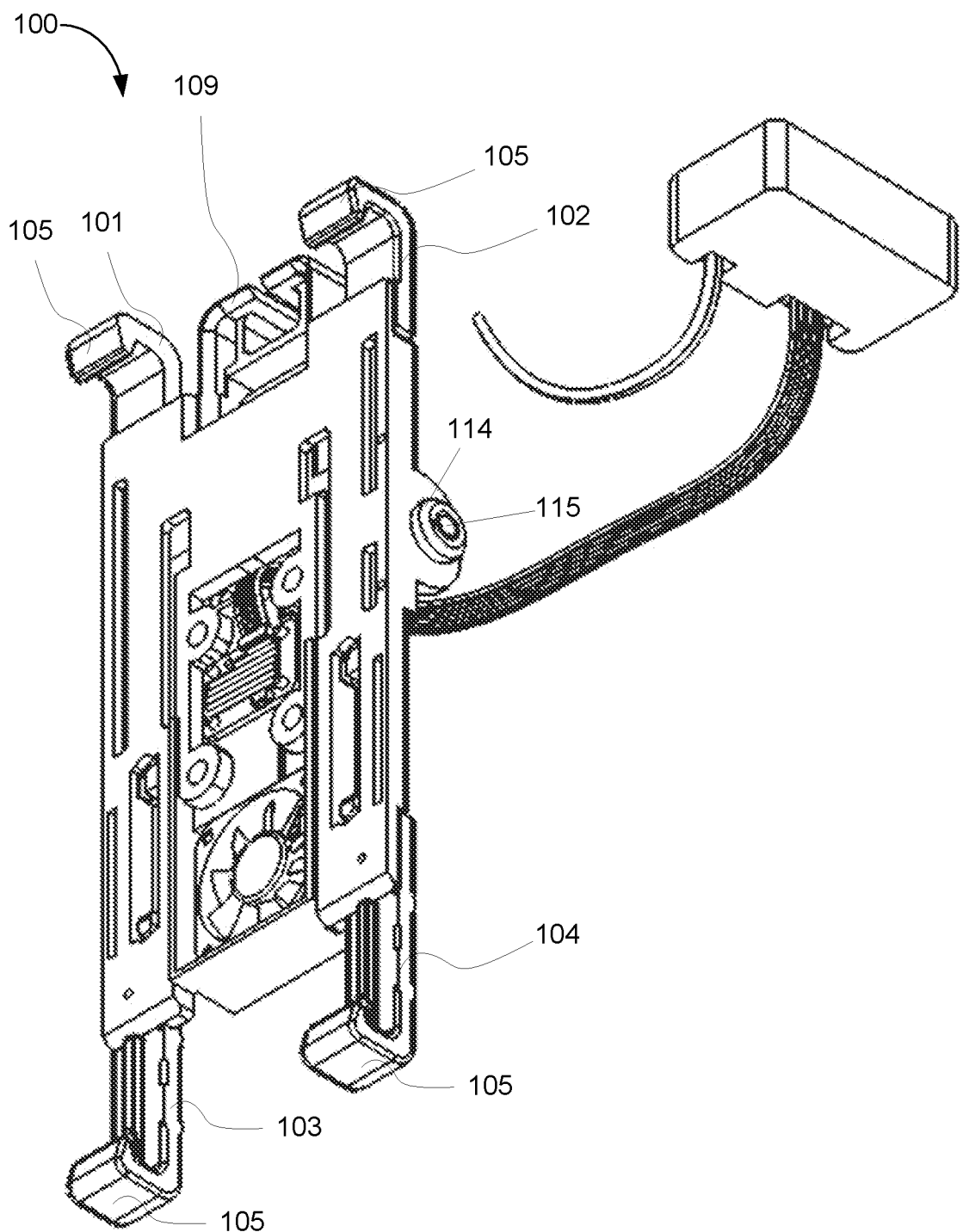
FIG. 3 is an isometric view thereof.

FIG. 3 is an isometric view of the cradle 100. Cradle 100 may include a locking mechanism 114, which would prevent arms 101 and 102 from extending away from arms 103 and 104, holding the tablet in place. This is depicted in additional detail in FIG. 9.

Cradle 100 may be configured to hold a bare tablet by gripping the tablet with cradle hooks 105, which extend from each of arms 101, 102, 103, and 104. The spring action of the arms 101, 102, 103, and 104, may allow for minor displacement of the upper arms relative to the lower arms, allowing a tablet to be inserted or removed from the cradle hooks 105. In this embodiment, cradle hooks 105 may include one or both of a cushion or grip type material, such as rubber or thermoplastic polyurethane. In preferred embodiments, cradle 100 is configured to interface with a case 200, depicted in FIG. 4.

Figure 4:
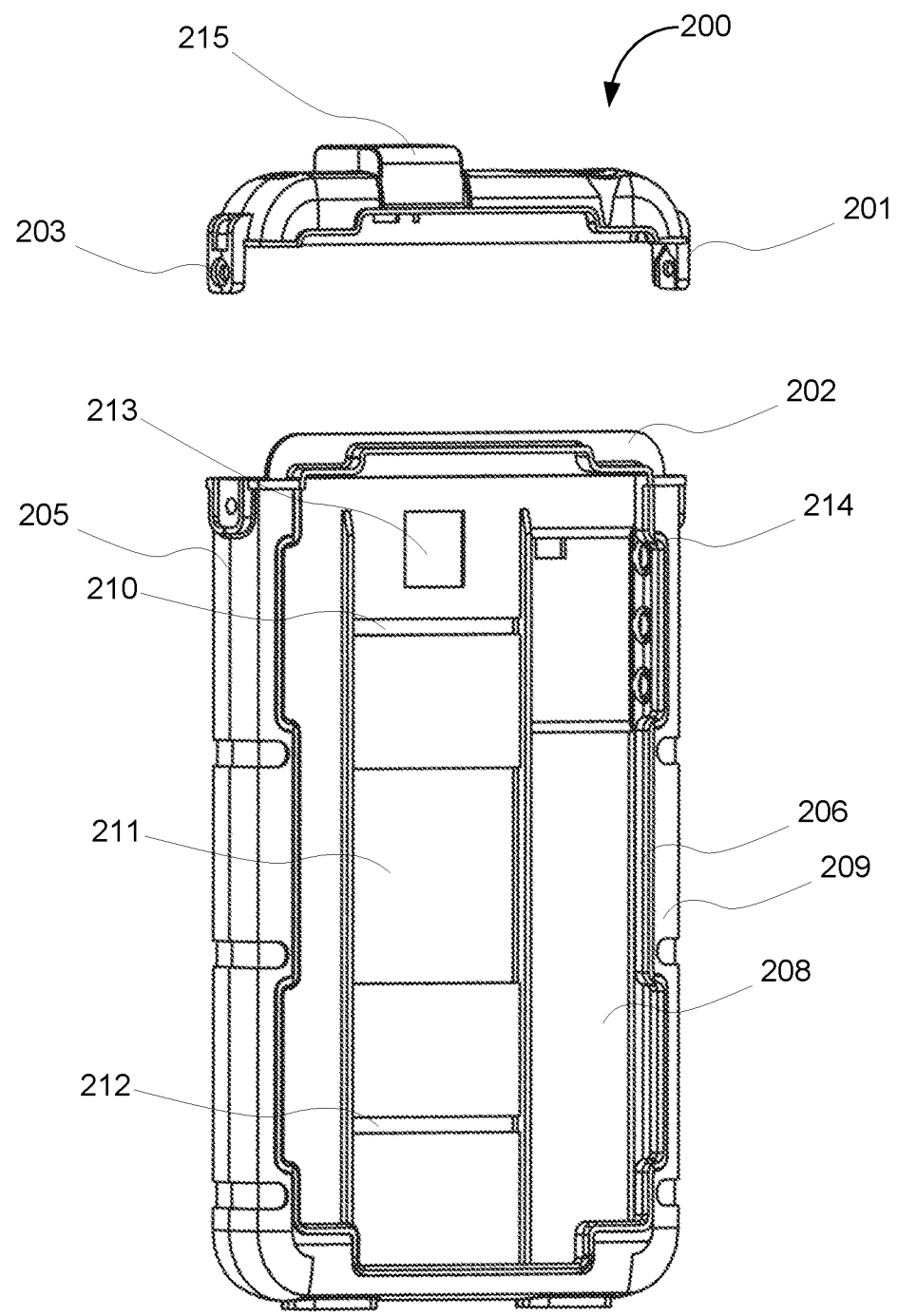
FIG. 4 is a front off-center view of one embodiment of the case.

FIG. 4 shows case 200 in two pieces, a top portion 201 and a bottom portion 202. It should be understood that this embodiment is one embodiment only, and that the proportions of top portion 201 and bottom portions 202 are exemplary and should not be construed as limiting. Additionally, the depiction of case 200 in a top portion 201 and a bottom portion 202 should not be construed as limiting the case to two portions; the case may be a single unit, stamped or molded as one piece, or it may be multiple pieces, depending on the specifications of a particular tablet or the needs of a particular driver or fleet. When case 200 is in two or more pieces, it may be configured to be coupled with coupler 203. Coupler 203 is depicted here as a bolt or screw-together coupler, with apertures on both top portion 201 and bottom portion 202. In some embodiments, top portion 201 and bottom portion 202 may be coupled with other mechanisms, such as with adhesive, with a squeeze fitting, with interlocking or snap fittings, and so on. It should also be noted that while top portion 201 is shown as the portion containing magnetic charger housing 215, the location of magnetic charger housing will depend on the specifications of a particular tablet. For example, here case 200 is shown with a camera aperture 213, and the magnetic charger housing 215 is depicted as being above and proximate to the end of the tablet in which a camera would be disposed. This configuration would be functional for a tablet where the charging port and the camera are located proximate to each other. However, it would not be function for some versions of tablets where the camera is located in a top portion of the tablet, and the charging port is located on the bottom edge, for example. Therefore, the particular depiction of FIG. 4 should not be construed as limiting the arrangement of the elements relative to one another. Magnetic charger housing 215 may include a gap piece for the magnetic charger, configured to span the distance between the wired portion and the dongle inserted into the tablet. The gap piece may have conductive magnetic elements on one or both ends, or it may be a conductive but non-magnetic element.

Case 200 may include sealed button covers 214. Sealed button covers 214 may be stamped or molded into the exterior wall 205, which forms an exterior perimeter of the case 200. Again, the particular location of sealed button covers 214 will depend on the type of tablet for which the case is being manufactured. Sealed button covers 214 may offer advantages for transport drivers by preventing the intrusion of water or fine particles, such as dust or oil, into the buttons of the tablet. Sealed button covers 214 may be configured to exert pressure on the tablets of the button with corresponding portions on the interior walls 206, which form the interior perimeter of case 200. This would allow a user to depress the button of the tablet without removing the tablet from the case 200. Together, exterior walls 205 and interior walls 206 form and may be referred to as walls 209.

While a solid case 200 may allow sufficient heating and cooling of the tablet, the embodiment depicted in FIG. 4 includes several gaps or apertures. Aperture 213, which allows a user to use a camera of the tablet, has already been discussed. Gap 211 may correspond to heating element 108, allowing radiant heat to reach the back of the tablet. One of gap 210 or 212 may be disposed over cooling element 107, allowing a fan, for example, to draw air through the gap. Cooler air may be drawn through the opposite gap, allowing for airflow over the back of the tablet. For example, if gap 210 is disposed over cooling element 107, air would be drawn through gap 210 and away from the tablet, as depicted in FIG. 2. Fresher air would then fill the space through gap 212, cooling the tablet. Air may also be drawn through gaps 211 and 213. In the event the cooling element 107 is a radiant or conductive cooling element, it may fit within the area designated as gap 211, which may be expanded, contracted, or reshaped to fit one or both of cooling element 107 and heating element 108. When inserted into case 200, a tablet may rest substantially within the perimeter formed by walls 209, specifically interior walls 206, and against a front surface 208, from which the required gaps may be stamped, removed, or molded into place.

Figure 5:
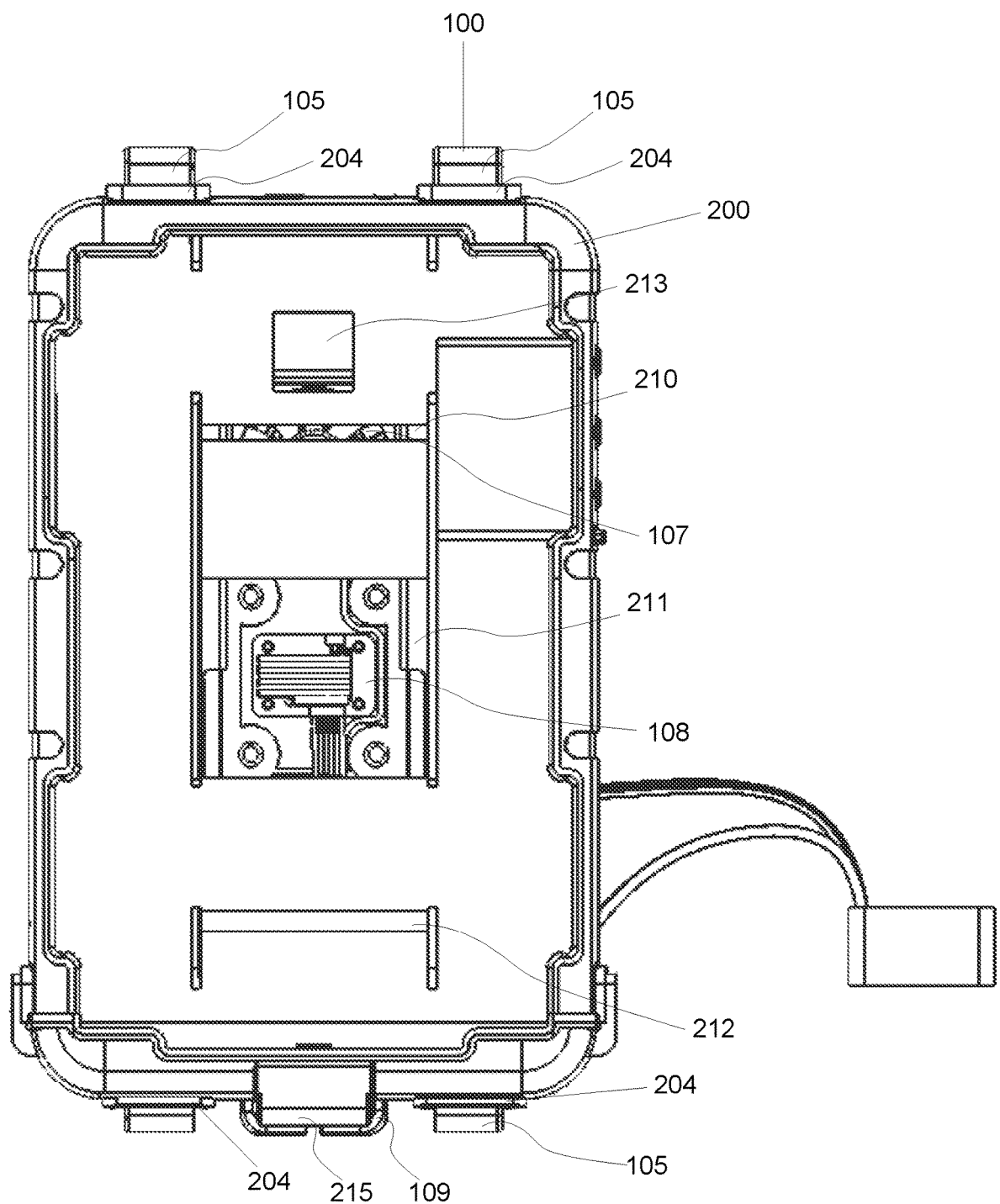
FIG. 5 is a front view of one embodiment of the case in place in one embodiment of the cradle.

FIG. 5 is a depiction of case 200 in cradle 100. Case 200 may include one or more cradle hook receivers 204, which correspond to cradle hooks 105. When a tablet with case 200 is inserted into the cradle, cradle hooks fit into cradle hook receivers, holding the case, and thus the tablet, safely in place. This is particularly useful for users facing a rough road or, in the case of pilots, air turbulence. With the spring action of the arms and the cradle hooks and receivers, the tablet should be secure in cradle 100 through most disruptions. FIG. 5 also shows how gaps 210, 211, 212, and 213 fit over elements 107 and 108, particularly. Finally, FIG. 5 also depicts a case 200 and cradle 100 designed for a tablet where the camera, represented by gap 213, is disposed away from the charging port, represented by charging frame 109 and housing 215.

Figure 6:
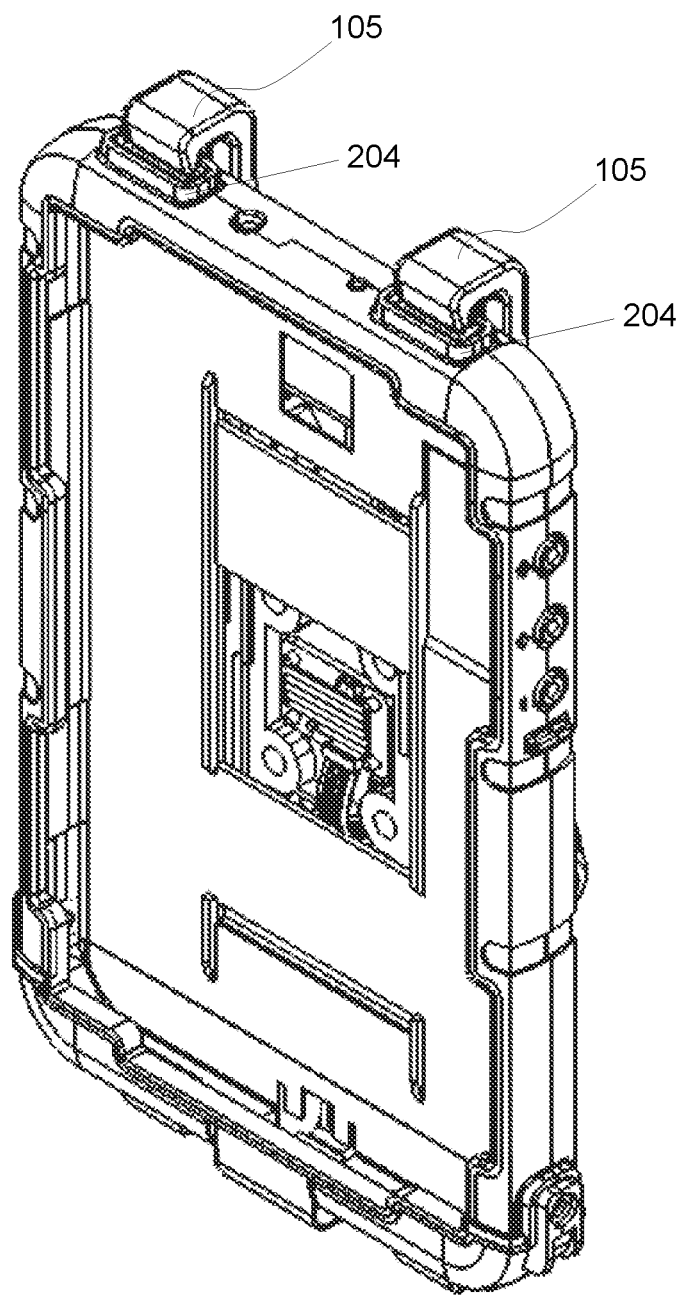
FIG. 6 is a top-isometric view of one embodiment of the case in place in one embodiment of the cradle.
Figure 7:
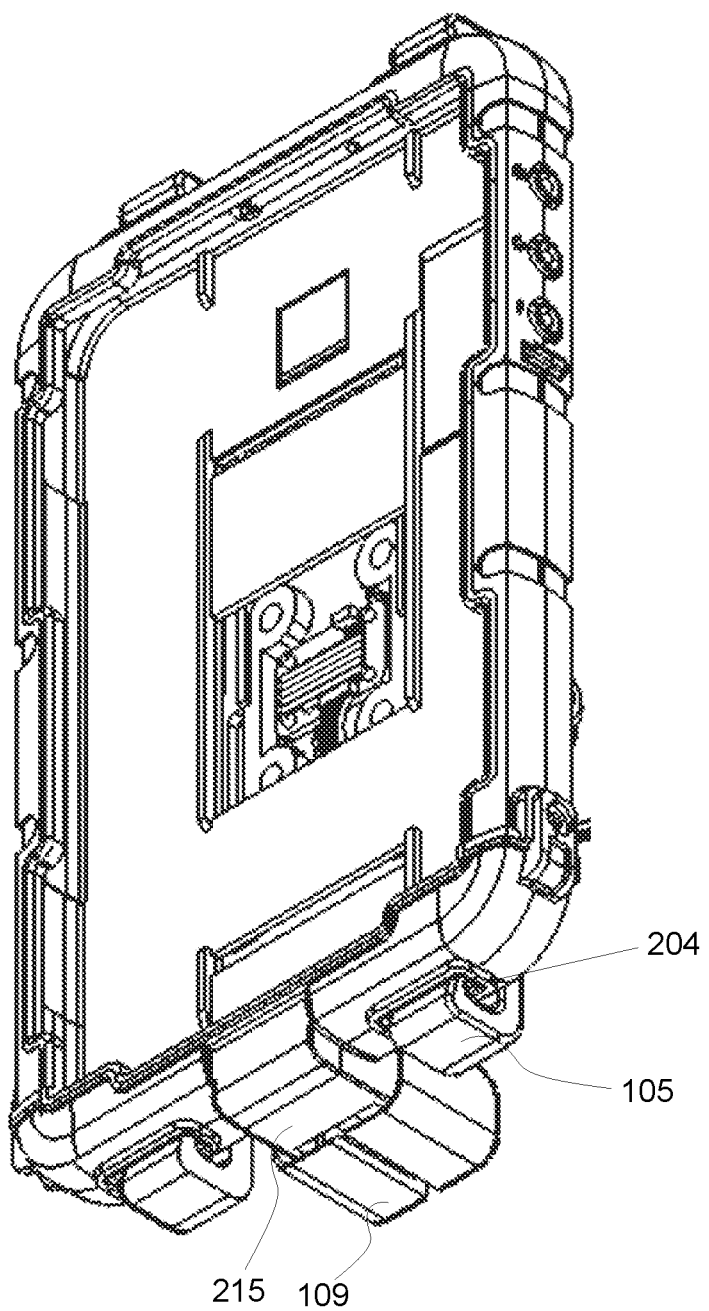
FIG. 7 is a bottom-isometric view of one embodiment of the case in place in one embodiment of the cradle.

FIG. 6 is a clearer representation of the interaction between cradle hooks 105 and hook receivers 204. FIG. 6 also shows that case 200 may include apertures for other tablet features, such as headphone jacks. These are not particularly labeled in FIG. 6, but may nonetheless be included depending on the specifications of a particular tablet. While only the upper hooks and receivers are shown in FIG. 6, lower hooks and receivers are depicted in FIG. 7. FIG. 7 also shows how magnetic charger housing 215 is configured to fit into magnetic charger frame 109.

Figure 8:
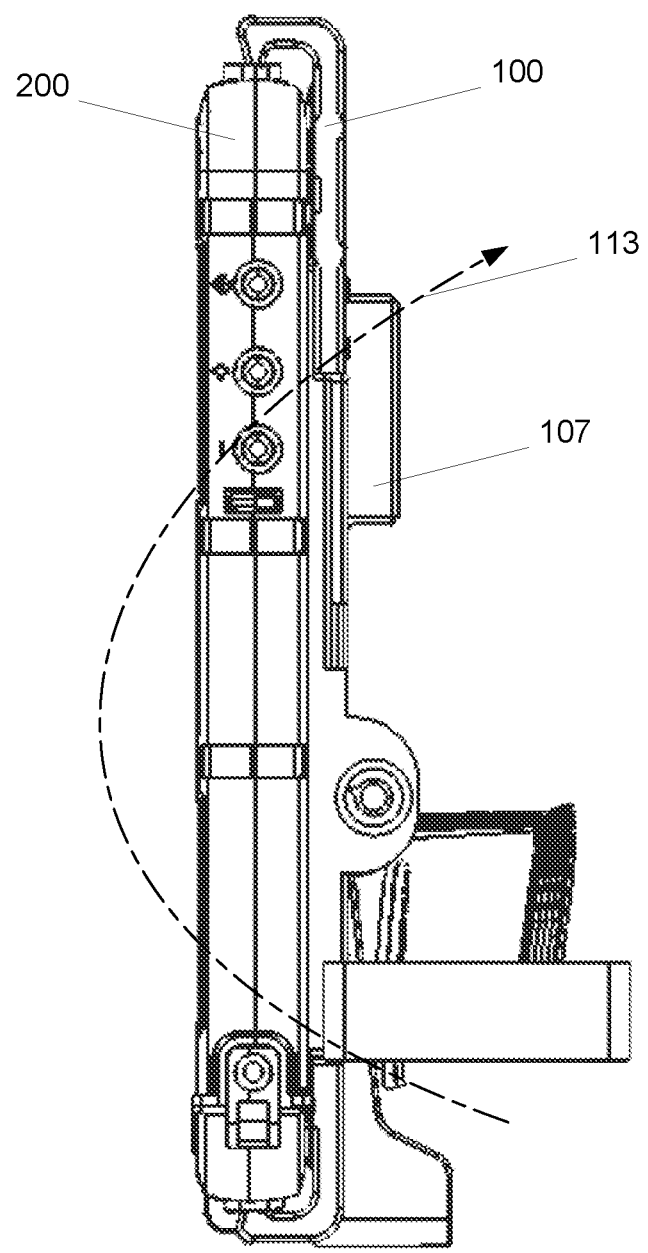
FIG. 8 is a side view of one embodiment of the case in place in one embodiment of the cradle.

FIG. 8 is a depiction of the direction of airflow, represented by line 113, when cooling element 107 is in use while a tablet with case 200 is in the cradle 100. Cradle 100 and tablet 200 have been specifically designed to work together, allowing for a secure dock for a tablet, while also allowing for the principal function of maintaining a tablet within an optimal temperature range for functionality. Case 200 may be substantially waterproof or water resistant, and it may be constructed of a durable material, such as thermoplastic polyurethane, which may absorb shock if the tablet is dropped while within the case. Case 200 may also include one or more straps, such as on the back portion of the case, to allow a user to hold the case when it is not in cradle 100.

FIG. 9 is a rear view of cradle 100 and case 200. Here it can be seen that a rear surface 207 of case 200 may rest against the cradle 100, on the front surface of the cradle 122, shown in FIG. 1. The rear surface 118 of the cradle 100 may include an area to receive a docking bracket 123, shown with additional elements in FIG. 10. It may also include cradle alignment elements 119 and 120. As described with FIG. 1, arms 101 and 102 may move away from arms 103 and 104 in order to accept or release the tablet. Flexible elements 106 return the arms to the proper relative position vertically, and alignment elements 119 and 120 may be used to maintain the proper relative position horizontally. For example, element 119 may be configured to receive element 120. When the arms are displaced for insertion or removal of the tablet, element 120 may slide out of element 119 for some distance, and then when the arms return to their proper position, element 120 may slide back into element 119. This keeps the arms from becoming displaced horizontally, which may apply a torque to the tablet, or may fail to hold it altogether. It should be understood that "vertical" and "horizontal" are illustrative here, and that the apparatus may be rotated 90 degrees, in which the motion described herein as vertical would become horizontal, and so forth.

FIG. 9 also includes a better depiction of the locking function of cradle 100. Cradle 100 may include an upper locking tab 115 and a lower locking tab 116. Each of the locking tabs 115 and 116 may include an aperture 117, through which locking pin 124 extends when lock 114 is engaged. Alternatively, lock 114 may be permanently engaged in locking tab 115, and locking pin 124 may extend through aperture 117 of locking tab 117 when the lock 114 is engaged. In either embodiment, lock 114 may prevent the upper arms, or upper portion of the cradle 100, from moving away from the lower arms or lower portion of the cradle, securing the tablet in place. Lock 114 may be a keyed lock, allowing the user to take the key with them for additional security when the user needs to leave the tablet in the vehicle.

Figure 10:
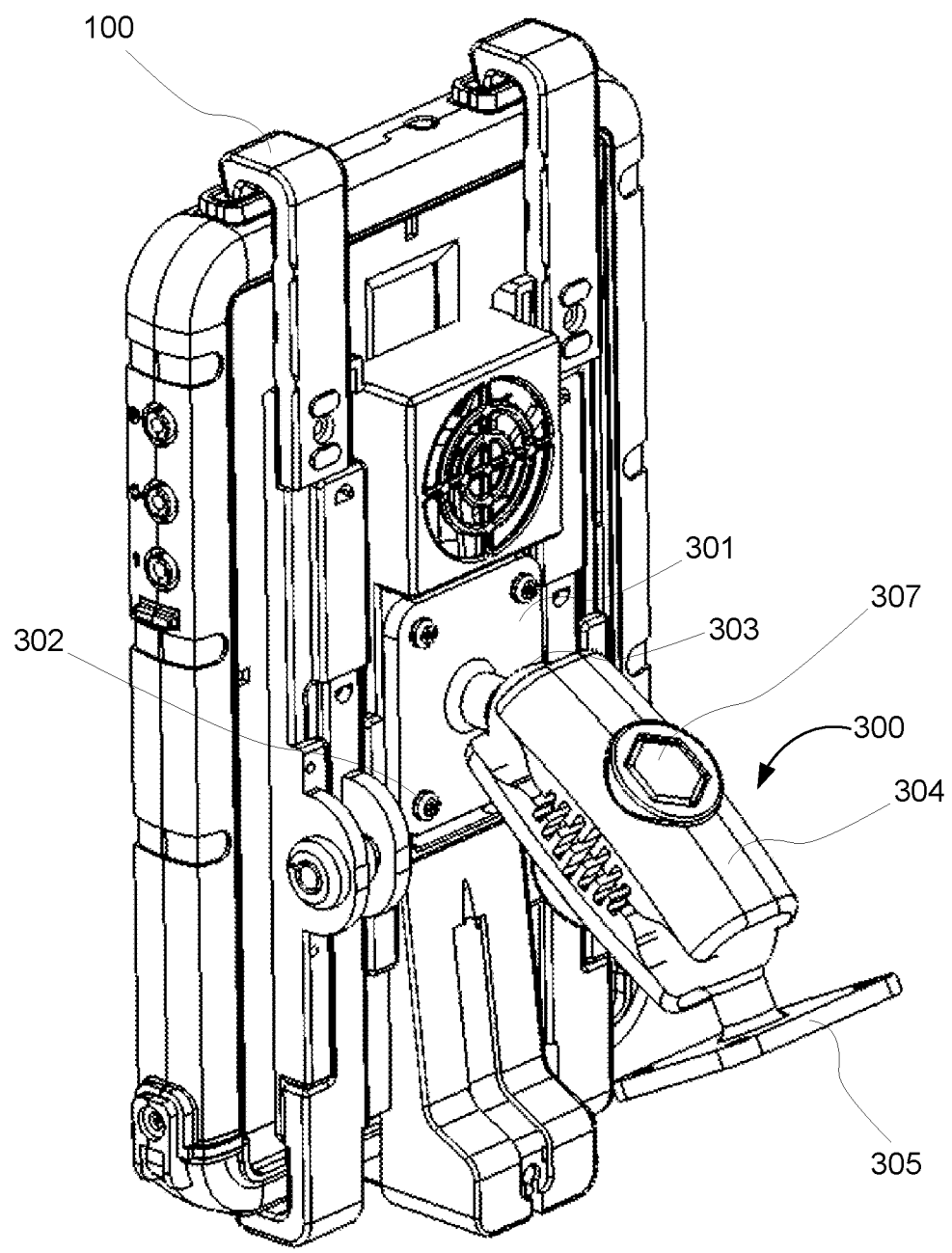
FIG. 10 is a rear view of one embodiment of the case in place in one embodiment of the cradle.

FIG. 10 is a depiction of how cradle 10 may be configured to be mounted in the vehicle. Vehicle mount 300 may be configured to attach to cradle 100 in the bracket receiving space 123, as seen in FIG. 9, with mounting bracket 301. Here it is shown that mounting bracket 301 may be coupled with cradle 100 with fasteners 302, such as screws, bolts, rivets, or other fasteners. It should also be understood that bracket 301 may be coupled to cradle 100 by adhesive, weld, or as a single piece cut, stamped, or molded with the cradle. Bracket 301 may include a ball joint 303 configured to be received by mounting post 304 on an end proximate to the cradle 100. Mounting post may be configured to be tightened around ball joint 303 with a tightening mechanism 307, which may be a bolt, a hex-bolt, a thumb screw, or the like. On an end of the mounting post 304 distal to the cradle 100, the mounting post may be configured to receive a second ball joint 306 coupled to a vehicle mounting system 305. Here the vehicle mounting system 305 is shown as a bolt-in style bracket, configured to be bolted to a dash, a floorboard, or some other structure of the vehicle. In other embodiments, vehicle mounting system 305 may be a suction cup for suction adherence to a dash or a windshield, for example, or it may be a positionable post configured to be mounted to a floorboard or a seat. As with ball joint 303, the ball joint 306 of the vehicle mounting system may be received by mounting post 304 and held in place by the tightening mechanism 307.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of this subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.).

While preferred and alternative embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A docking mount for a mobile device, comprising:
  a spring controlled dock including at least:
    a cavity capable of mobile device receiving;
    a left cradle arm having an upper portion and a lower portion; and
    a right cradle arm having an upper portion and a lower portion,
    wherein each of the left cradle arm and the right cradle arm include at least one spring element disposed between the upper portion and the lower portion such that the upper portion and the lower portion will return to original relative positions if displaced;
  a charging connection including at least one USB connection operatively coupled with the spring controlled dock and capable of mobile device charging;
  a lock operatively coupled with the spring controlled dock and capable of mobile device retaining; and
  a fan disposed adjacent to the cavity, the fan capable of mobile device cooling.

2. The docking mount of claim 1, further comprising:
  an interface for coupling the docking mount with a mounting post securable to a vehicle.

3. The docking mount of claim 2, wherein the interface for coupling the docking mount with a mounting post securable to a vehicle comprises:
  a ball and socket interface.

4. The docking mount of claim 1, wherein the charging connection comprises:
  a magnetic charging connection.

5. The docking mount of claim 1, wherein the lock comprises:
  a keyed lock.

6. The docking mount of claim 1, wherein the spring controlled dock including at least a cavity capable of mobile device receiving comprises:
  a spring loaded dock including at least a cavity capable of mobile device receiving.

7. The docking mount of claim 1, wherein the spring controlled dock including at least a cavity capable of mobile device receiving comprises:
  a spring controlled dock including at least a cavity capable of receiving a sleeve containing a mobile device, the mobile device interfacing with the charging connection including the at least one USB connection operatively coupled with the spring controlled dock via the sleeve containing the mobile device.

8. A docking mount for a mobile device, comprising:
  a left cradle arm having an upper portion and a lower portion;
  a right cradle arm having an upper portion and a lower portion;
  a central cradle portion disposed between the left cradle arm and the right cradle arm, the central cradle portion including at least:
    one or more temperature adjustment units; and
    one or more temperature sensors; and
  one or more control units operatively coupled with the one or more temperature adjustment units and the one or more temperature sensors,
  wherein each of the left cradle arm and the right cradle arm include at least one spring element disposed between the upper portion and the lower portion such that the upper portion and the lower portion will return to original relative positions if displaced.

9. A docking mount for a mobile device, comprising:
  a left cradle arm having an upper portion and a lower portion;
  a right cradle arm having an upper portion and a lower portion;
  a central cradle portion disposed between the left cradle arm and the right cradle arm, the central cradle portion including at least:
    one or more temperature adjustment units; and
    one or more temperature sensors; and
  one or more control units operatively coupled with the one or more temperature adjustment units and the one or more temperature sensors, wherein each of the left cradle arm and the right cradle arm include an upper cradle hook and a lower cradle hook.

10. The docking mount of claim 9, wherein the one or more control units operatively coupled with the one or more temperature adjustment units and the one or more temperature sensors comprises:
the one or more control units configured to engage one or more of at least one heating function or at least one cooling function of the central cradle portion.

11. The docking mount of claim 8, wherein the one or more control units operatively coupled with the one or more temperature adjustment units and the one or more temperature sensors comprise:
the one or more control units configured to engage at least one heating function of the central cradle portion if the one or more temperature sensors sense a temperature below a particular point.

12. The docking mount of claim 8, wherein the one or more control units operatively coupled with the one or more temperature adjustment units and the one or more temperature sensors comprise:
the one or more control units configured to engage at least one cooling function of the central cradle portion if the one or more temperature sensors sense a temperature above a particular point.

13. The docking mount of claim 8, wherein the one or more temperature adjustment units comprise:
a cooling element including a fan configured to direct air flow through one or more gaps in the central cradle portion and away from a rear of the docking mount.

14. The docking mount of claim 8, wherein the one or more temperature adjustment units comprise:
a heating element configured to heat air between the docking mount and a mobile device through at least one of radiation, convection, or conduction.

15. The docking mount of claim 8, wherein the one or more temperature adjustment units comprise:
a heating unit and a cooling unit disposed in the central cradle portion and oriented such that the heating unit and the cooling element are stacked vertically.

16. A docking mount for a mobile device, comprising:
a left cradle arm having an upper portion and a lower portion, wherein the upper portion and the lower portion include at least:
a spring disposed between the upper portion and the lower portion; and
at least one cradle arm alignment element configured to maintain the relative position between the upper portion and the lower portion when the upper portion and lower portion are displaced relative to one another;
a right cradle arm having an upper portion and a lower portion, wherein the upper portion and the lower portion include at least:
a spring disposed between the upper portion and the lower portion; and
at least one cradle arm alignment element configured to maintain the relative position between the upper portion and the lower portion when the upper portion and lower portion are displaced relative to one another;
a central cradle portion having an upper portion and a lower portion, wherein the upper portion is disposed between and coupled to the upper left cradle arm and the upper right cradle arm, and the lower portion is disposed between and coupled to the lower left cradle arm and the lower right cradle arm, the central cradle portion including at least:
at least one cooling element;
at least one heating element; and
one or more temperature sensors; and
one or more control units operatively coupled with the at least one cooling element, the at least one heating element, and the one or more temperature sensors.

17. The docking mount of claim 16, wherein the at least one cooling element and the at least one heating element are vertically stacked.

18. The docking mount of claim 16, wherein the one or more control units are configured to engage the cooling element when ambient air temperature goes above a maximum temperature, and wherein the one or more control units are configured to engage the heating element when ambient air temperature goes below a minimum temperature.

19. The docking mount of claim 16, wherein the one or more control units are configured to be wired into a power system of a motor vehicle.

20. The docking mount of claim 16, wherein the central cradle portion comprises:
at least one docking mount disposed on a rear surface of the central cradle portion.

* * * * *